United States Patent
McDowell

(10) Patent No.: US 11,204,405 B1
(45) Date of Patent: Dec. 21, 2021

(54) DYNAMIC STABILIZATION OF MAGNETIC FIELDS

(71) Applicant: Andrew F. McDowell, Albuquerque, NM (US)

(72) Inventor: Andrew F. McDowell, Albuquerque, NM (US)

(*) Notice: Subject to any disclaimer, the term of this patent is extended or adjusted under 35 U.S.C. 154(b) by 35 days.

(21) Appl. No.: 16/934,389

(22) Filed: Jul. 21, 2020

Related U.S. Application Data

(60) Provisional application No. 62/876,868, filed on Jul. 22, 2019.

(51) Int. Cl.
| | | |
|---|---|---|
| *G01R 33/383* | (2006.01) | |
| *H01F 7/02* | (2006.01) | |
| *G01R 33/389* | (2006.01) | |

(52) U.S. Cl.
CPC ......... *G01R 33/383* (2013.01); *G01R 33/389* (2013.01); *H01F 7/0278* (2013.01)

(58) Field of Classification Search
CPC .... H01F 7/0278; G01R 33/383; G01R 33/389
See application file for complete search history.

(56) References Cited

U.S. PATENT DOCUMENTS

| | | |
|---|---|---|
| 2,179,305 A | 11/1939 | Stickney et al. |
| 2,719,267 A | 9/1955 | Kunz et al. |
| 3,018,422 A | 1/1962 | Seaton |
| 3,434,054 A | 3/1969 | Dean |
| 3,460,083 A | 8/1969 | Johnson |
| 4,672,346 A | 6/1987 | Miyamoto et al. |
| 4,673,882 A | 6/1987 | Buford |
| 6,448,772 B1 | 9/2002 | Aoki |
| 7,148,689 B2 | 12/2006 | Huang et al. |
| 7,759,938 B2 | 7/2010 | Prado et al. |
| 2004/0095141 A1* | 5/2004 | Watanabe ............ G01R 33/383 324/318 |

* cited by examiner

*Primary Examiner* — Ramon M Barrera
(74) *Attorney, Agent, or Firm* — Rod D. Baker

(57) ABSTRACT

An apparatus and method for dynamically stabilizing the fields in a permanent magnet assembly, including a nuclear magnetic resonance machine. One or more magnetically active elements affect the fields of the magnet assembly. A mechanism controls and changes the position(s) of the magnetically active element(s) to affect and adjust the magnetic field strength in the working volume of the assembly. A sensor provides a control signal indicating the status of the magnetic field strength, and an algorithm is executed for determining, based on the signal, the manner in which the adjustment should be made. The adjustment may be continuous and dynamic, and stabilization of the field may occur during operation of the permanent magnet assembly. The adjustments of the position of the magnetically active element stabilize the field without unduly degrading the field homogeneity, even for high homogeneity magnets.

28 Claims, 9 Drawing Sheets

DYNAMIC STABILIZATION OF MAGNETIC FIELDS

CROSS REFERENCE TO RELATED APPLICATIONS

This application claims priority to and the benefit of the filing of U.S. Provisional Patent Application Ser. No. 62/876,868 entitled "Dynamic Stabilization of Magnetic Fields," filed 22 Jul. 2019, the entire disclosure of which is incorporated herein by reference.

BACKGROUND OF THE INVENTION

Field of the Invention

This invention relates generally to methods and devices for stabilizing the magnetic fields of magnets, particularly dynamically stabilizing the magnetic field of permanent magnet assemblies, and more particularly to overcoming the effects of changes in magnet temperature on the strength of the magnetic field in high resolution magnets for use in magnetic resonance apparatuses.

Background Information

For devices requiring a magnetic field, permanent magnet materials may be an advantageous choice. Unlike resistive electromagnets technologies, the permanent magnets require no external current source. Unlike superconducting technologies, permanent magnets require no cryogenic fluids or other cooling devices. Devices utilizing permanent magnets may be significantly smaller, lighter, and more robust than devices using other sources of magnetic field.

Permanent magnetic materials, for example magnetically "hard" materials such as NeFeB or SmCo, are frequently used as elements of assemblies consisting of one or more pieces or blocks of permanent magnetic material, structural materials to hold the blocks in place, and magnetically soft materials, such as iron or low-carbon steel, to control the shape of the magnetic field and provide a low-reluctance path for magnetic flux. In general, the permanent magnet assembly is designed to produce a magnetic field of a particular strength and uniformity in a working volume. Other design considerations for the assembly may include size, weight, cost, and a desire to minimize the degree to which magnetic fields extend into spaces beyond the outer boundary of the assembly.

Permanent magnet materials have known disadvantages for use in devices. It is not yet possible to manufacture these materials with a high degree of accuracy in magnetic field strength or orientation. For devices requiring precisely specified or very uniform magnetic fields, it is often necessary to provide a way to adjust the magnetic field after the permanent magnet assembly has been constructed. In general, the magnetic field produced by a block of permanent magnet material is also temperature dependent. This is especially true for NeFeB, which is otherwise among the most attractive materials due to its high magnetic field strength. NeFeB has a large 1,000 ppm per degree Celsius thermal coefficient. Materials with lower thermal coefficients are available, including SmCo at approximately 350 ppm, and also temperature compensated materials with coefficients as low as 10-30 ppm. However, these materials are not as magnetically strong as NdFeB, so a larger volume of material is required. In the case of the compensated materials, the cost may be prohibitive.

In many cases, devices utilizing permanent magnet assemblies must include substantial thermal insulation and may also require active temperature control elements to maintain the assembly at a constant temperature. This may be particularly important for assemblies designed to achieve high homogeneity levels, for example <1 ppm variation across the working volume. The requirements of thermal management may make the device unattractively large, heavy, and may undermine its portability.

The use of magnetically active elements to adjust the magnetic field during manufacture of permanent magnet assemblies has long been known in the art. In 1937, U.S. Pat. No. 2,179,305 to Stickney (1937) taught a means for calibrating an electrical measurement device of the D'Arsonval type, wherein a magnetic member is shaped and positioned in such a way as to adjust the effective magnetic flux in the magnetic circuit of the device. The calibration means does not include a controlling mechanism or sensor, and no provision is made for continuous or dynamic adjustment of the magnetic field. Once adjusted into calibration, the measurement device is utilized as is.

U.S. Pat. No. 2,719,267 to Kunz teaches a design for a readily manufactured permanent magnet assembly for use in electrical instruments having a permanent magnet core. Kunz teaches that one or more of the assembly screws, whose main purpose is to hold the pieces of the assembly in place, may be made of a magnetic material such as steel. In this case, as the position of the screw is changed, it may alter the flux density (i.e. field strength) in the operative portion of the device. The purpose of this adjustment is not discussed, but there is no controlling mechanism, no sensor of magnetic field strength, and no provision made for continuous or dynamic adjustment of the magnetic field during operation of the device.

U.S. Pat. No. 3,434,054 to Dean teaches a method for adjusting the magnetic field strength in a permanent magnet assembly intended for use in electrical meters. According to Dean, a ferromagnetic slug or equivalent element is movable in and out of an aperture so as to increase or decrease the magnetic reluctance of a flux path connecting the magnetic poles on a path that does not pass through the operative flux gap (i.e. the working volume). By changing the reluctance of this path, an adjustable diversion of a small part of the magnetic flux is achieved, which alters the effective flux value in the operative region of the permanent magnet assembly. Dean does not teach a mechanism for controlling the movable ferromagnetic slug, or a sensor for monitoring the field strength, or an algorithm that determines how the mechanism should control the position of the movable ferromagnetic element.

U.S. Pat. No. 3,018,422 to Seaton teaches a permanent magnet assembly with a continuously variable magnetic field. The field strength is adjusted by rotating (and thereby translating) one or two ferromagnetic sleeves that surround the permanent magnet material and act as a variable shunt for diverting an adjustable portion of the magnetic flux, thereby altering the field strength in the working region of the assembly. No provision is made for a mechanism for moving the sleeves, no sensor is described, and no algorithm for dynamically controlling or stabilizing the field is included.

U.S. Pat. No. 3,460,083 to Johnson teaches a method for adjusting the strength of the magnetic field of a permanent magnet assembly utilizing a magnetic shunt similar in function to that described in U.S. Pat. No. 3,018,422 just discussed, but with the shunt internal to the permanent magnetic material pieces. Johnson does not include a mechanism for controlling the position of the shunt, nor do they include a sensor of magnetic field or an algorithm for determining how the mechanism should position the movable shunt.

U.S. Pat. No. 7,148,689 to Huang teaches a permanent magnet assembly with a fixed permanent magnet body with an opening and a movable permanent magnet body at least partially within that opening, with the movable body used to bring the magnetic field to a particular field strength. The movable body is movable during the field adjustment process and does not move while the permanent magnet assembly is in operation. There is no mention of a mechanism for positioning the movable element, nor a sensor for magnetic field strength, nor an algorithm for controlling the mechanism.

U.S. Pat. No. 6,448,772 to Aoki teaches a design for a permanent magnet assembly that includes numerous field adjustment elements, including adjusting bolts located behind and next to the permanent magnet blocks, and movable yokes, located at a central location behind the blocks. These adjustable elements provide for coarse adjustment of the magnetic field. Aoki makes no mention of a mechanism for moving the adjustment elements, nor a sensor for magnetic field strength, nor an algorithm for appropriately adjusting the elements for maintaining a fixed field strength during operation of the device.

U.S. Pat. No. 4,672,346 to Miyamoto teaches an adjustable permanent magnet assembly for nuclear magnetic resonance computed tomography, with numerous adjustment mechanisms for achieving the field strength and uniformity in the device. The adjustments include positional control of the assembly's pole pieces, movable shunts positioned inside the permanent magnet blocks, and magnetically active screws that protrude into the region of the gap near the working volume of the device. No provision is made for a mechanism to move the adjustment elements during operation of the device, nor is there mention of any sensor or algorithm to properly move the adjustment elements. The challenge of thermal affects causing the previously adjusted magnetic field to change strength is mentioned, but this challenge is met by including thermal insulation, not by manipulating the adjustment elements.

U.S. Pat. No. 7,759,938 to Prado teaches a permanent magnet assembly with movable adjustment rods that may protrude through the permanent magnet blocks. These rods shunt or divert a portion of the magnetic flux produced by the blocks, leading to changes in the magnetic field strength in the working volume of the device. The position of the rods may be controlled by a motor actuator. Prado teaches the use of the rods to allow the device to switch between two field strengths, with a magnetic resonance measurement being made at each of the field strength values. There is no magnetic field sensor, nor any algorithm for controlling the rod positions to counteract changes in the field due to thermal effects. Changes in the magnetic field strength due to temperature are addressed by Prado through the use of temperature control.

U.S. Pat. No. 4,673,882 to Buford teaches a permanent magnet assembly that may be adjusted to produce a desired magnetic field strength. The assembly contains a multitude of movable ferromagnetic rods that extend into the gap of the assembly and serve to guide the field lines toward the working volume of the device. The front surfaces of the plurality of rods become, in effect, the pole pieces of the magnet assembly. Due to the lack of fixed pole pieces in Buford's design, the movement of the rods has a comparable effect on both the strength and uniformity of the magnetic field in the working volume. Buford teaches a positioning mechanism in the form of motors that may move the rods toward or away from the working volume, thereby changing the magnetic field strength and uniformity ("configuration"). Buford also teaches a sensor for detecting the magnetic field strength at one or more predetermined locations in the working volume, and a means of controlling the positions of the movable rods responsive to the field strength detectors in such a way as to produce a desired magnetic field strength at the predetermined locations. Once the magnet has been configured at a desired magnetic field strength, the sensor array is presumably removed from the working volume in order to allow the subject of investigation to be placed in the assembly. No provision for maintaining or stabilizing the field strength during operation of the device is described.

The entire disclosures of all the foregoing patents are incorporated herein by reference.

It is the object of the present invention to provide a method for stabilizing the magnetic field of a permanent magnet assembly that reduces or eliminates the requirements for thermal insulation or power to heat or cool the assembly. Instead, a mechanical means for dynamically stabilizing the field is disclosed. The mechanical device may require low power to stabilize the field. The new method is capable of having a rapid response, so that rapidly occurring fluctuations in the field strength may be corrected. Hence, the new apparatus and method are useful for managing many other sources of changes to the magnetic field strength, not only those due to temperature variations.

SUMMARY OF THE INVENTION

The presently disclosed invention builds on known methods for adjusting the magnetic field in a static manner using screws or tuning slugs or other magnetically active elements during the construction of a permanent magnet assembly. The invention extends beyond this known art by including a mechanical mechanism for controlling the position of the magnetically active element so as to affect the magnetic field strength in the working volume of the assembly, a sensor or other means that provides a control signal indicating the status of the magnetic field strength, and an algorithm for determining the manner in which the adjustment should be made. The adjustment may be continuous and dynamic, and stabilization of the field may occur during operation of the device utilizing the assembly. The adjustments of the position of the magnetically active element can stabilize the field without unduly degrading the field homogeneity, even for high homogeneity magnets.

DETAILED DESCRIPTION OF THE INVENTION

Figure 1:
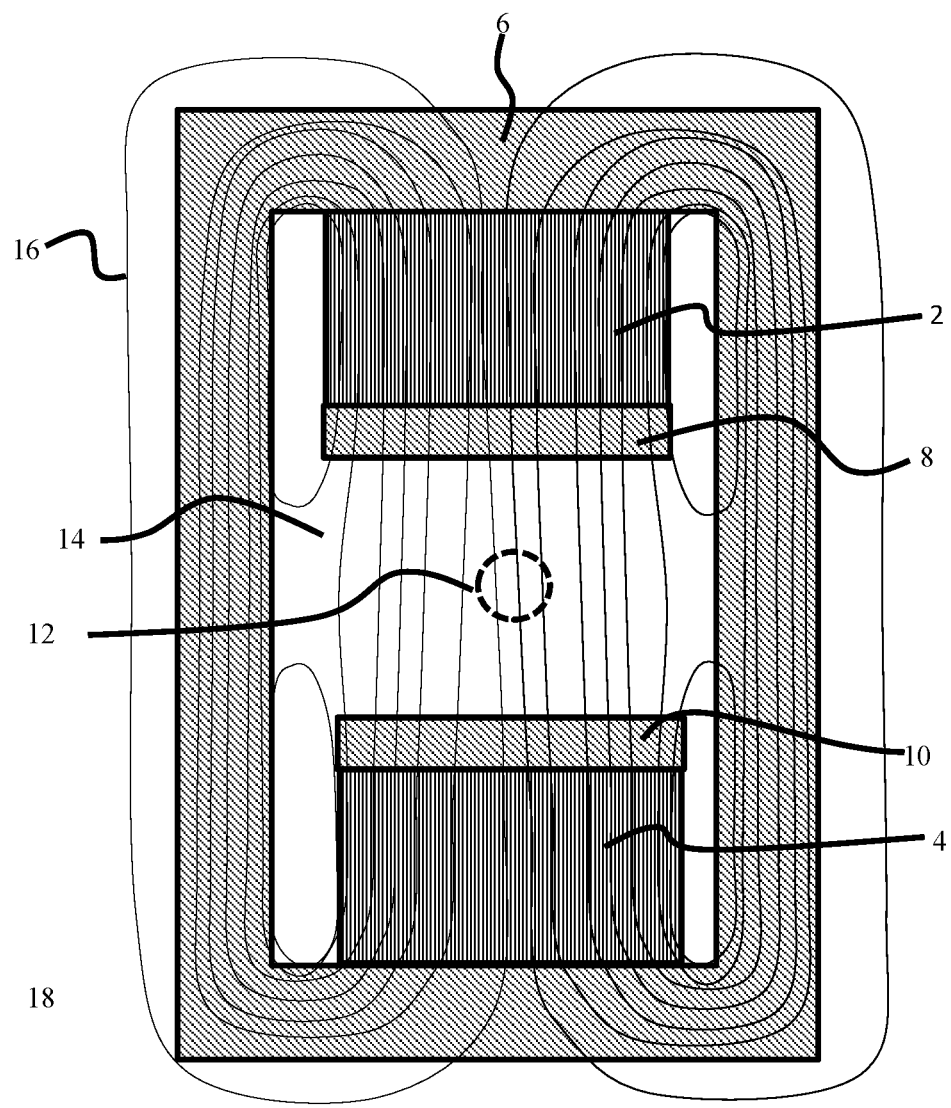
FIG. 1 is a simple side sectional view of an example permanent magnet assembly known in the art.

To understand the concepts and methods disclosed herein, it is helpful to consider the simple model of a permanent magnet assembly shown in FIG. 1. It will be appreciated by those skilled in the art that there are numerous alternative designs that may be employed, and that the device shown in FIG. 1 is not a complete magnet assembly for producing a magnetic field in a working volume.

FIG. 1 shows a simplified sketch of a permanent magnet assembly as may be found in the existing art, shown in cross section. Two blocks 2 and 4 of permanent magnet material are shown inside a yoke 6. The blocks and yoke are shown in cross section, and may be either cylindrical or rectilinear in an actual three-dimensional assembly. The blocks 2 and 4 have a magnetization that points in a common direction, which may be taken as pointing upwards in FIG. 1, without loss of generality. The assembly contains pole pieces 8 and 10 shown in contact with permanent magnet blocks 2 and 4. The pole pieces serve to improve the strength and uniformity of the magnetic field in the working volume 12 of the assembly. The working volume 12 is located in the gap space 14 in between the two pole pieces. Here, the working volume is depicted in cross section as a circle, although it may have other shapes in actual assemblies; it may also be larger or smaller in relative size than depicted in FIG. 1. Here, the pole pieces are depicted as having a simple flat surface on the sides facing the gap space 14. In practice, to achieve an improved homogeneity, the pole faces may have a raised ring of material along their outer circumference. The poles may also be augmented by passive shimming structures, such as small pieces of magnetic material, as is known in the art. These details of the pole construction and its associated passive shimming structures are not relevant to the invention disclosed here, and we consider all such details subsumed in our references to pole pieces.

The lines of magnetic flux 16 are sketched schematically in FIG. 1. As is well known in the art, the lines of flux are a depiction of the magnetic field. The field at any point is tangent to the line passing through that point, and the strength of the field is indicated by the density of the lines. The lines form closed loops that pass through the assembly and through the regions of space interior and exterior to the items making up that assembly. The art of magnet design may be considered to be the manipulation of the paths taken by the lines of flux in order to achieve the desired magnetic field. For a device requiring a strong, homogeneous field, for example, the assembly would be designed to have uniform, dense, straight lines of flux passing through the working volume 12.

The yoke 6 of the magnet serves multiple purposes, including allowing a higher field strength in the working volume 12 by providing a low-reluctance path for the magnetic flux 16. The yoke also helps contain the magnetic field largely within the physical extent of the permanent magnet assembly, reducing the degree to which the field extends outward, or "fringes," into the surrounding space 18. Finally, as depicted in FIG. 1, the yoke provides the structural connection between the two blocks of magnetic material. The yoke is typically constructed from a structurally strong, high-permeability, magnetically soft material, such as low carbon steel. In its structural role, the yoke is what sets the width of the gap 14, that is, the distance between the surface of the poles that face the gap. Many of the typical materials used to construct magnet yokes have a non-zero coefficient of thermal expansion on the scale of 10 ppm per degree Celsius. This gives the gap width a dependence on temperature, which gives rise to an additional source of temperature dependence of the strength of the magnetic field in the working volume 12. The invention disclosed here can be used to compensate for this additional dependence.

Figure 2:
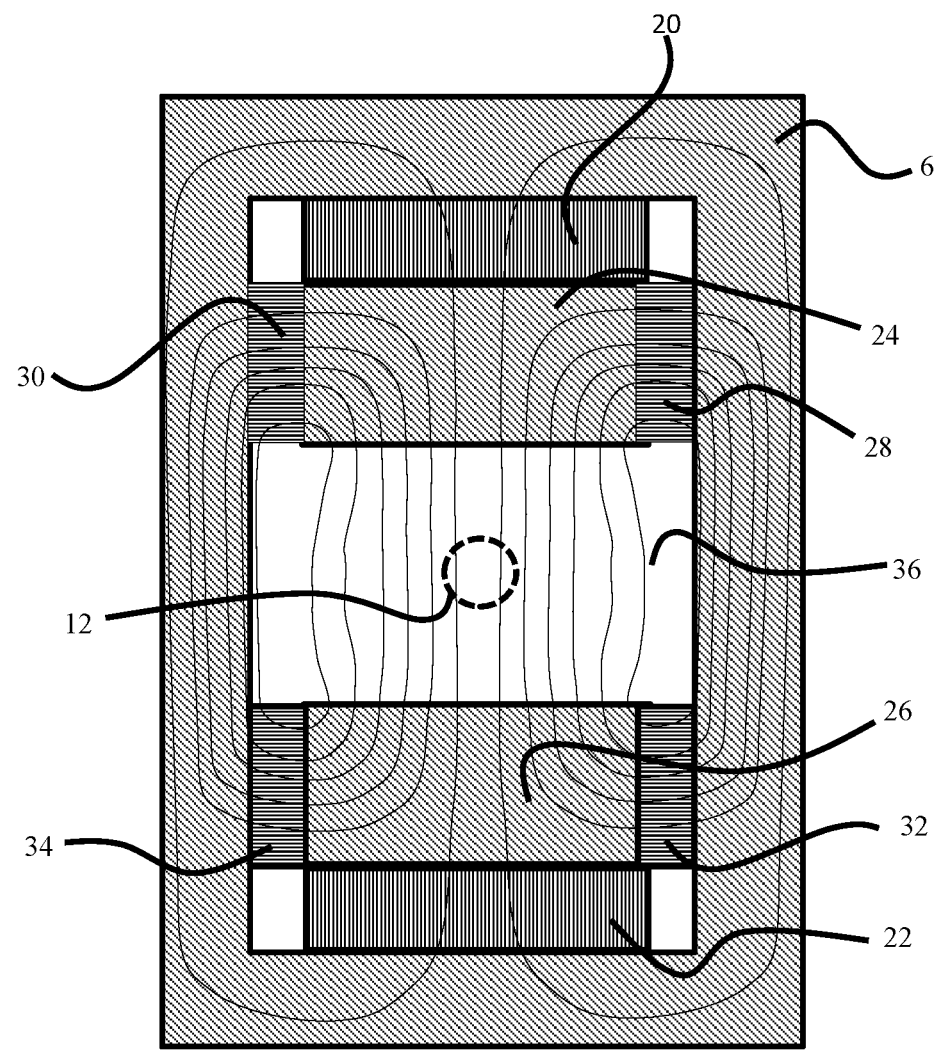
FIG. 2 is a simple side sectional view of a second example of a permanent magnet assembly known in the art.

FIG. 2 presents a second example of a permanent magnet assembly, shown in cross section. This shares many of the features of the assembly of FIG. 1. It has a yoke 6 onto which permanent magnet blocks 20 and 22 are shown attached. The two poles 24 and 26 are attached to the blocks, and there is a working volume 12, again depicted as having a circular cross section, without loss of generality. There are also additional magnet blocks 28, 30, 32, and 34, shown in cross-section as flanking the poles. As an example, if the cross section of FIG. 2 was for an assembly of an overall cylindrical form, then the poles 24 and 26 would be generally cylindrical and the magnet blocks 28, 30, 32, and 34 would form annular structures surrounding the poles. Considering first the upper pole 24, the assembly may be constructed with the upper magnet block 20 having a magnetization that points generally upward, away from the pole 24. Then the optimal orientation for the magnetizations of blocks 30 and 28 would be outward, away from the pole 24. Similarly, the magnet blocks 22, 32, and 34 surrounding the lower pole 26 would all point toward the pole. The magnetic flux lines 36, again sketched schematically, are similar to but slightly different from the flux lines sketched on the assembly shown in FIG. 1.

Figure 3:
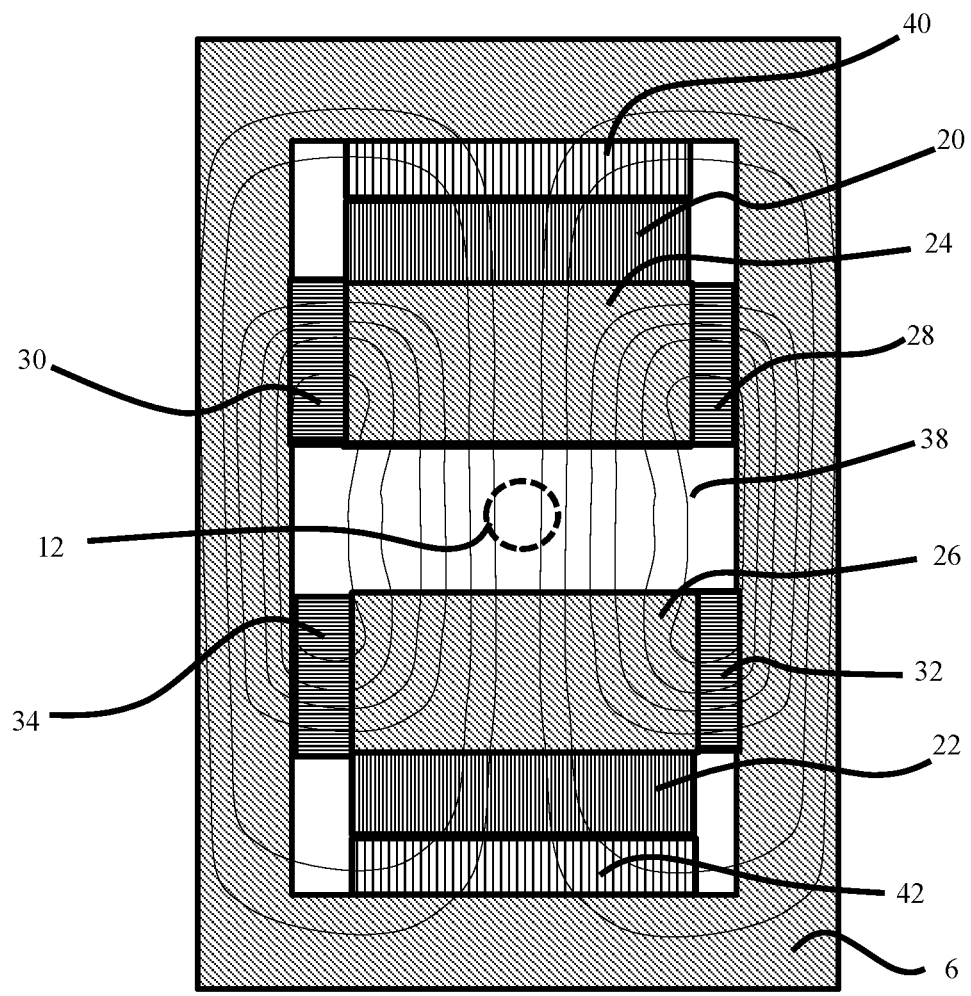
FIG. 3 is a side sectional view of a third example of a permanent magnet assembly known in the art.

FIG. 3 presents a third example of a permanent magnet assembly, shown in cross section. This assembly shares many elements with the assembly shown in FIG. 2: the poles 24 and 26, the magnet blocks 20, 22, 28, 30, 32, and 34, and the yoke 6. FIG. 3 also shows non-magnetic spacers 40 and 42 positioned between the yoke 6 and the upper and lower magnet blocks 20 and 22. The non-magnetic spacers may be made of a material that has a low magnetic permeability, such as aluminum or brass. Such materials present a high reluctance path for the lines of flux, and so alter the pattern of flux lines 38 through the permanent magnet assembly.

The assemblies in FIGS. 1, 2 and 3 constitute examples of permanent magnet assemblies capable of providing a magnetic field in a working volume. Many other designs for assemblies are known in the art. For example, FIG. 1 may be considered to be the cross-section of an H-magnet, as is known in the art. We now consider additional innovative features that add the capability for stabilizing the field, which is the subject of the invention disclosed herein.

Figure 4:
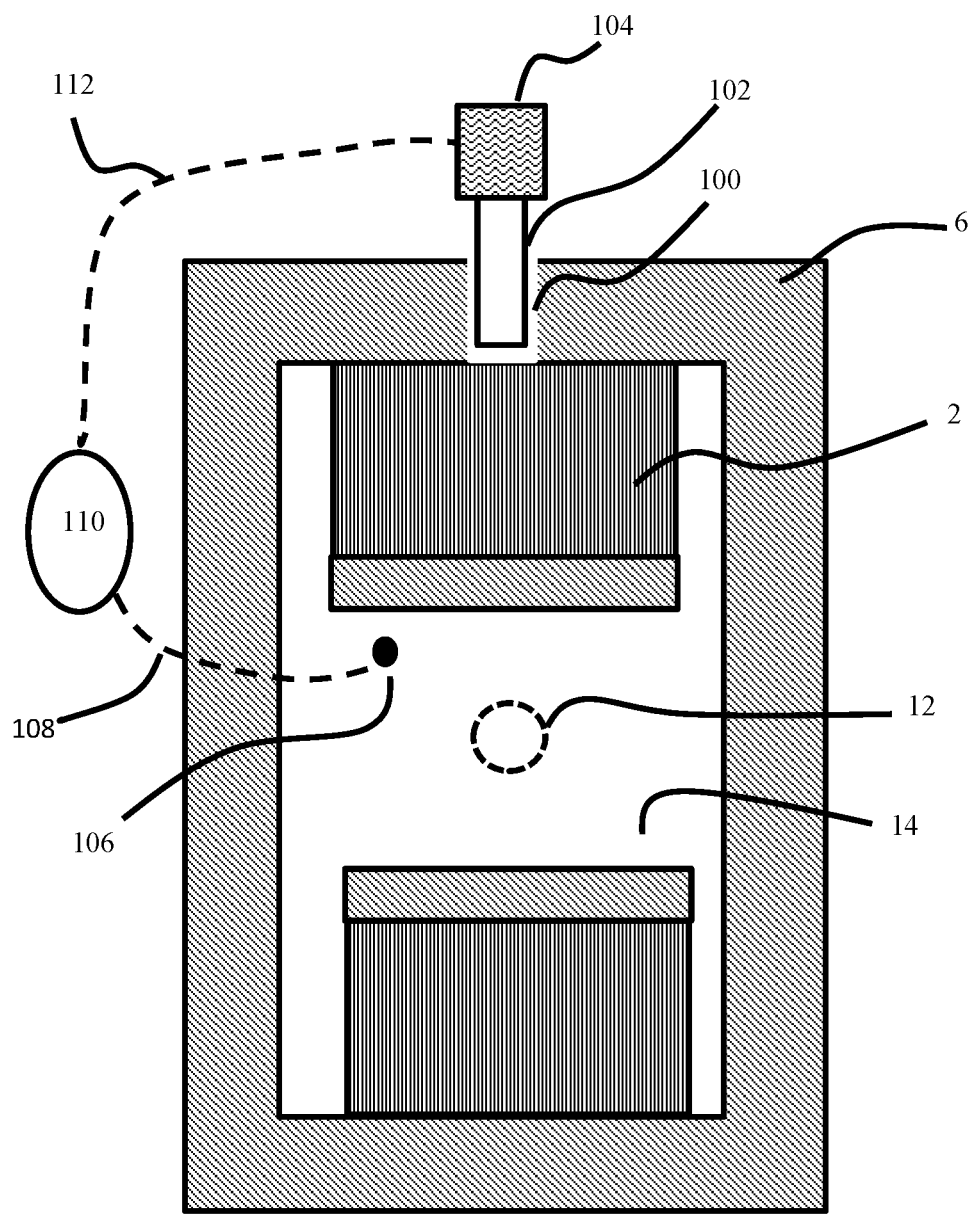
FIG. 4 is a diagrammatic side sectional view of an embodiment of an apparatus according to the present invention, for the dynamic stabilization of magnetic fields of a permanent magnet assembly.

FIG. 4 shows the assembly of FIG. 1, but with additional inventive features shown, in accordance with the present apparatus and method. The yoke 6 has a hole 100 located in a symmetric location above the upper permanent magnet block 2. The hole 100 may impact the overall reluctance of the flux path provided by the yoke, as is known in the art. Magnetically active element 102 is shown in a position partially filling the hole 100. Being "magnetically active" means that the element 102 has an impact on the magnetic flux through the various regions of the permanent magnet assembly. The element 102 may be magnetically active by virtue of being made of a magnetically soft material, such as low carbon steel, iron, or a similar material. The element 102 may be magnetically active by virtue of being made of a magnetically hard material. The element 102 may be magnetically active by having a magnetic permeability that differs in value from the magnetic permeability of the material that would otherwise occupy the hole 100, for example air.

A mechanism 104 for moving the element 102 is shown attached to the element. Positioning mechanism 14 is any mechanical device known in the art suitable for imparting translational and/or rotary movement to the magnetically active element 102, and preferably is electrically powered, and may include a small motor. Under the control of positioning mechanism 104, the magnetically active element 102 may adopt any position within a regional location formed by the hole 100 and the region of space above the hole on FIG. 4. At different positions, the element 102 has different impacts on the manner in which the lines of magnetic flux travel through the permanent magnet structure 2. In particular, the manner in which the lines of flux travel across the gap 14, and hence the strength of the magnetic field in the working volume 12, will be affected. For example, if the mechanism 104 moves the element 102 further up in the hole 100, the field in the working volume 12 may decrease, while if the element is moved down further into the hole, the field may increase. Whether the field increases or decreases depends on the details of the magnet design, the location of the hole 100, the nature of the element 102, and other details which are secondary to the invention being disclosed.

It is advantageous for changes in the position of the element 102 to have an impact on the field strength that is larger than the impact on the field uniformity in the working volume 12. For example, the field uniformity may be specified by the maximum deviation of field values in the working volume from the average field value in that volume. Changes in the average field value in a volume of space and the maximum deviation of the field values from the average values in the volume of space may be specified using the same physical units. These units may be units of magnetic field strength, such as Gauss or Tesla, or they may be expressed in relative unit such as part per million (ppm), as is common in the art. When the element 102 is moved to a new position, it is advantageous if the change in the average value of the field is substantially larger than the maximum deviation of the magnetic field values from the average values in the volume 12. Whether or not this is the case depends in large part on the regional location in which the element 102 moves. It is most advantageous if the average field value in the working volume 12 changes by an amount of 1,000 times or more larger than the change in the maximum variation of the field values across the working volume. It may still be useful to practice the invention if the impact on the average value is only 100 times, or only 10 times, larger than the impact on the variation of the field values. For the location in the hole 100 indicated in FIG. 4, as an illustrative example, it is possible to change the average field value in a working volume 12 of diameter 8 mm by 15,000 ppm while causing a change in the total variation in the field value of only 50 ppm. Using a smaller magnetically active element 102 is possible to change the field value by 500 ppm while changing the uniformity by less than 5 ppm. In such cases, the field value is changed to a much larger amount than the field homogeneity.

The action of magnetic active elements of the type described above is well known in the art, where they are used to adjust the magnetic field of an individual permanent magnet assembly to a final, desired strength value. In the prior art, the position of the magnetically active element 102 is held fixed during the subsequent time of use of the assembly, for example during the next measurement made after a calibration step using the device containing the assembly.

FIG. 4 also shows a sensor 106 of magnetic field strength located in the gap 14 but outside of the working volume 12. This sensor 106 could be a Hall Effect sensor or other sensor of magnetic field, or it could be a sensor of temperature or other quantity that is related to the magnetic field strength in the working volume 12. The sensor provides a control signal 108 related to the strength of the magnetic field. This control signal may be used in an algorithm 110 to determine in a central processing unit 112 the positioning of the magnetically active element 102 by the positioning mechanism 104. For example, when the control signal 108 is such that it indicates the magnetic field is weaker than desired, then the algorithm 110 may determine that the mechanism 104 should move the element 102 further into the hole 100 to strengthen the field. If the signal 108 indicates a field that is stronger than desired, the algorithm 110 may determine that the mechanism 104 should move the element 102 a bit out of the hole 100 to bring the field value back down. The extent of the motion required may not be simply related to the control signal 108, in which case it may be advantageous to develop and deploy an algorithm that calculates the appropriate position for the element 102 based on the control signals the algorithm has received. The algorithm 110 may seek to control the magnetic field strength in the working volume 12 so that the field value maintains a fixed, constant value. The algorithm 110 may seek to maintain the field value to lie within a range of values within predetermined upper and lower field values. The algorithm 110 may seek to control the field value so that it changes in time in a predetermined manner. The algorithm 110 may function during a time interval of utilization of the device incorporating the permanent magnet assembly, so that dynamic field stabilization is achieved.

In FIG. 4, the sensor signal connection 108, the algorithm 110, and the connection 112 to the mechanism are intended as conceptual, schematic representations. These elements may exist in other forms, or may be incorporated into other portions of the system. For example, the algorithm 110 may be implemented within the positioning mechanism 104. For a different example, the sensing of the magnetic field may be accomplished via a measurement performed by the apparatus incorporating the permanent magnet assembly. The single sensor 106 may be replaced by multiple sensors placed at multiple locations. Multiple sensors may each be independently connected to the algorithm 110. No separate sensor 106 may be required. No control signal 108 connecting the sensor to the algorithm 110 may be required. Many other possible implementations of the concepts discussed here can achieve the functioning of the invention, as will be recognized by those skilled in the art.

The algorithm may be an implementation of a mathematical function in software. The mathematical function may be a linear or non-linear relationship between the magnetic field strength and position of the magnetically active element. The algorithm may make a calculation from the sensor signal related to the magnetic field strength and determine a desirable position for the magnetically active element. The algorithm may contain a lookup table that relates sensor signals to desirable changes in position of the magnetically active shim elements. The algorithm may store sensor signals over time and utilize the time dependence of the sensor signals in determining the optimal position for the magnetically active elements. The algorithm may fit a collection of sensor signal values to a mathematical function using least-squares methods or other approaches as are known in the art. The algorithm may take as inputs one or more signals related to magnetic field strength and may calculate desired positions of one or more magnetically active elements. The algorithm may be implemented on a general purpose central processing unit, a microcontroller, a field-programmable gate array device, an application specific integrated circuit, or any other electronic device as is known in the art. The algorithm may be a digital algorithm, or it may be an analog algorithm. The algorithm may be implemented by mechanical means.

If the device containing the permanent magnet assembly is used over a time interval during which the field strength may otherwise be changing in an undesirable manner, it may be advantageous for the algorithm 110 to have predictive capabilities. In this case, the element 102 may be moved to preemptively correct an anticipated field error. It may be advantageous for the algorithm to employ feedback methods to stabilize the magnetic field over a time interval. The algorithm 110 may seek to maintain the field strength in a specified range or band of values surrounding a set value. The algorithm may employ proportional-integral-derivative type control methods, as is known in the art. The magnetically active element 102 may be moved during the same interval in time as the magnetic field is used by some device.

A way to summarize the presently disclosed inventive system and method is as an apparatus or process for dynamically stabilizing the magnetic field strength in the working volume of a permanent magnet assembly. The apparatus may consist of at least one movable, magnetically active element. Each element may have a regional location wherein its position within that region affects the strength of the magnetic field in the working volume. The regional location may be chosen such that the element therein has an impact on the average field value in the working volume that is substantially stronger than its impact on the uniformity of the magnetic field in the volume. Each element has an associated mechanism capable of moving and controlling the position of the element in its regional location. There may be at least one sensor of magnetic field strength capable of producing a signal, and an algorithm for determining the manner in which each mechanism moves its associated element in response to the one or more sensor signals. The apparatus may perform so that the magnetic field strength in the working volume is maintained such that it remains within a predetermined range of values during a time interval of utilization of the apparatus.

Figure 5:
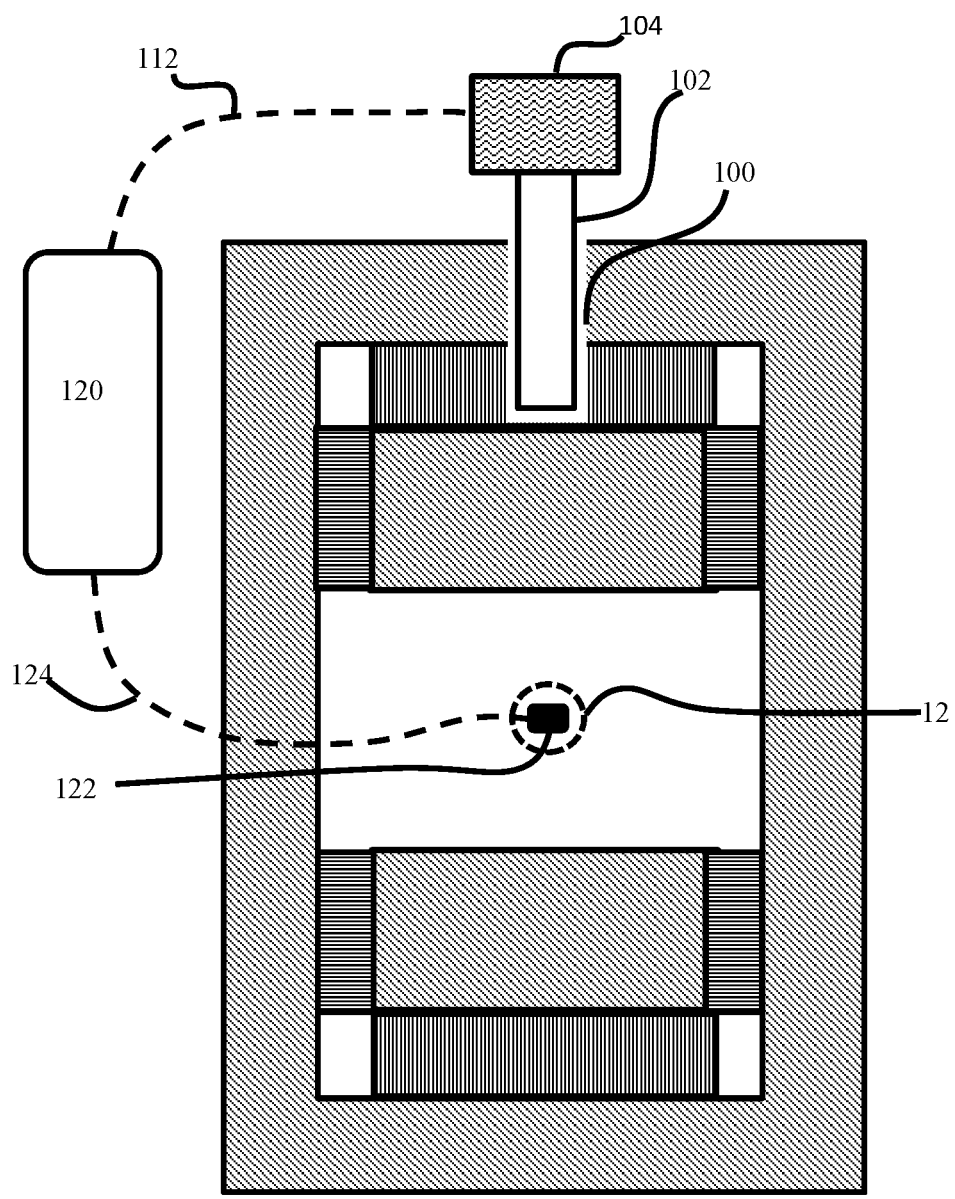
FIG. 5 is a diagrammatic side sectional view of an alternative embodiment of an apparatus according to the present invention, for the dynamic stabilization of magnetic fields of a permanent magnet assembly.

FIG. 5 depicts a permanent magnet assembly and field stabilization device of the type generally presented in FIG. 2, and illustrating a preferred embodiment of the present invention. In this case, the assembly is assumed to be being used in an apparatus that performs a nuclear magnetic resonance (NMR) measurement. The NMR measurement is carried out using a probe 122 located in the working volume 12 of the permanent magnet assembly. The probe 122 contains a sample (not shown) and the probe is built so that it may convey by transmission signal 124 the NMR signal of the sample back to the NMR console electronics 120. The NMR signal is a time-varying voltage signal that contains information related to the physical or chemical state of the sample. The signal also contains information about the strength of the magnetic field experienced by the sample. As is known in the NMR measurement art, the value of the field is often not of direct interest.

The invention disclosed herein may be practiced by making use of the information in the NMR signal regarding the strength of the magnetic field. The NMR console may determine the strength of the magnetic field from the NMR signal, and then use this information as an input to the algorithm that sends a control signal 112 to the positioning mechanism 104 that controls the position of the magnetically active element 102 located in a regional location 100, wherein the position of the element controls the strength of the magnetic field in the working volume 12. In this case, the NMR signal generated by the sample acts as a sensor of magnetic field, and no additional sensor is required. The algorithm may be implemented in software running on the NMR console itself.

In an apparatus which performs the NMR measurement, the NMR probe 122 may perform the role of the sensor of magnetic field. The signal 124 conveying the value of the magnetic field strength sensed by the sensor to the algorithm may be the NMR signal itself. The algorithm to determine how the magnetically active element 102 or elements should be moved in their regional locations may be software that is executed within the NMR console electronics 120. The NMR console software or hardware may analyze the NMR signal to determine the magnetic field strength, calculate how the magnetically active element 102 should be moved on the basis of a mathematical formula or a software algorithm, and may send a control signal to the mechanism 104 that moves and controls the position of the magnetically active element 102 so that the field strength of the permanent magnet assembly is controlled according to the needs of the device.

This preferred embodiment of the invention disclosed herein may be expressed as a device for dynamically stabilizing the magnetic field strength in the working volume 12 of a permanent magnet assembly used in a high resolution magnetic resonance apparatus. The apparatus may consist of at least one movable, magnetically active element 102. Each element 102 may have an associated regional location (e.g., defined in part by the element hole 100) wherein its position within that region affects the strength of the magnetic field in the working volume 12. The regional location may be chosen such that the element 102 therein has an impact on the average field value in the working volume 12 that is substantially stronger than its impact on the uniformity of the magnetic field in the volume 12. Each element 102 has an associated positioning mechanism 104 capable of moving and controlling the position of the element 102 in its regional location. The apparatus may carry out a calculation of the strength of the magnetic field from the information in the NMR signal, after which an algorithm may determine the manner in which each mechanism 104 moves its associated element 102 in response to the calculation of the field strength. The apparatus acts so that the magnetic field strength in the working volume 12 is maintained such that it remains within a predetermined range of values during a time interval of utilization of the apparatus.

Figure 6:
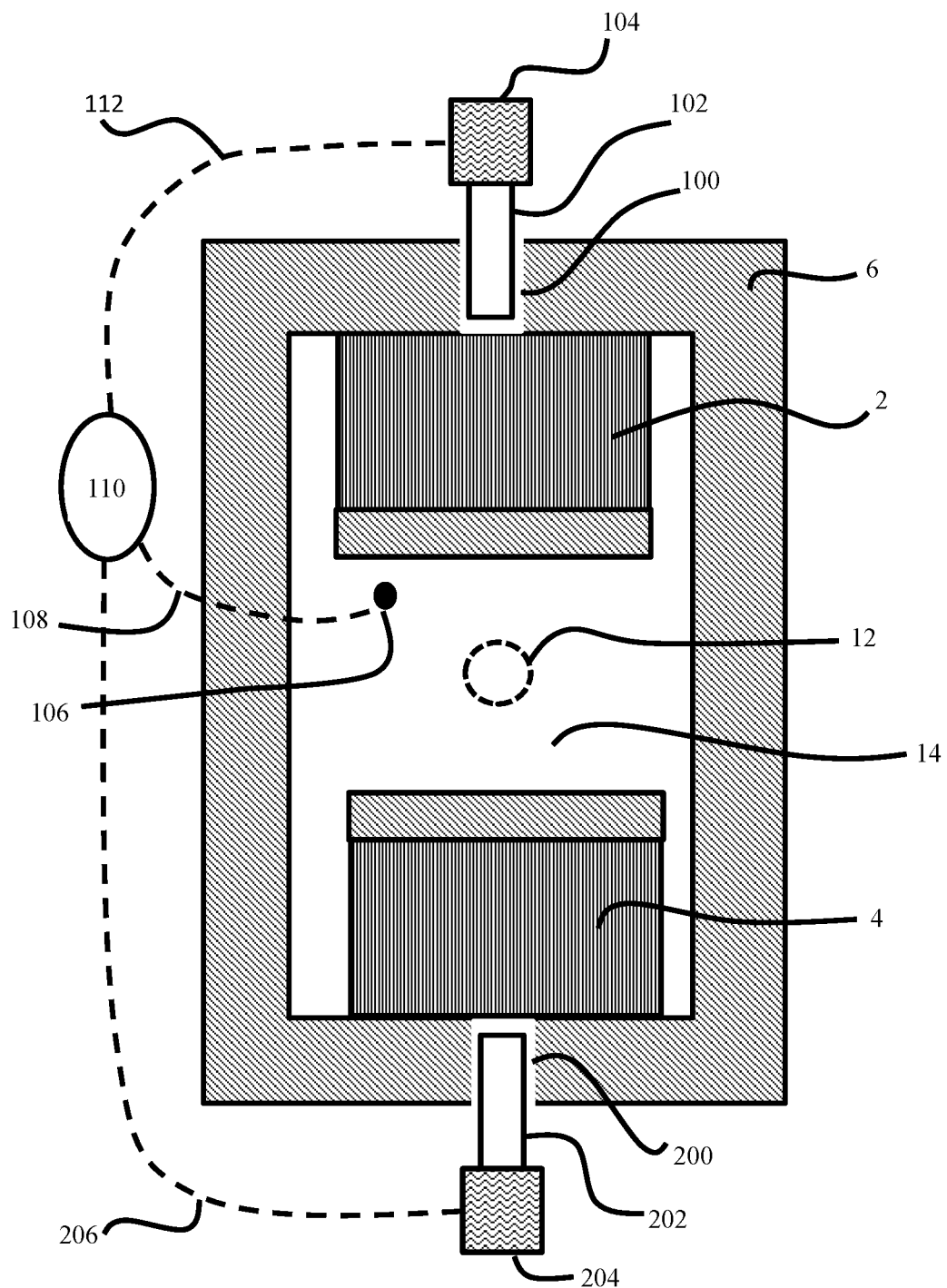
FIG. 6 is a diagrammatic side sectional view of still another alternative embodiment of an apparatus according to the present invention, for the dynamic stabilization of magnetic fields of a permanent magnet assembly.

It may be advantageous to arrange the one or more magnetically active elements 102 in regions located symmetrically with respect to the permanent magnet assembly structure. This may allow for the magnetic field value to be affected more than the homogeneity of the field. FIG. 6 shows an illustrative example. This figure is largely similar to FIG. 4, with equivalent items labeled with the same numbers in the two figures. In addition, FIG. 6 shows a second hole 200 in the yoke 6 that provides a regional location for a second magnetically active element 202, whose location is controlled by the second mechanism 204, in response to a control signal 206 from the algorithm 110. These additional items form a second field adjustment assembly in addition to the first assembly formed by items 100, 102, 104 and 112, shown at the top of the magnet system. By arranging to have two assemblies, one at the top (centered behind the upper permanent magnet block 2) and another at the bottom (centered behind the bottom permanent magnet block 4), adjustments to the field strength in the working volume 12 may have a smaller effect on the uniformity of the magnetic field in the working volume. The adjustments to positions of magnetically active elements 102 and 202 may be symmetrically, with both elements moving the same amount.

Figure 7:
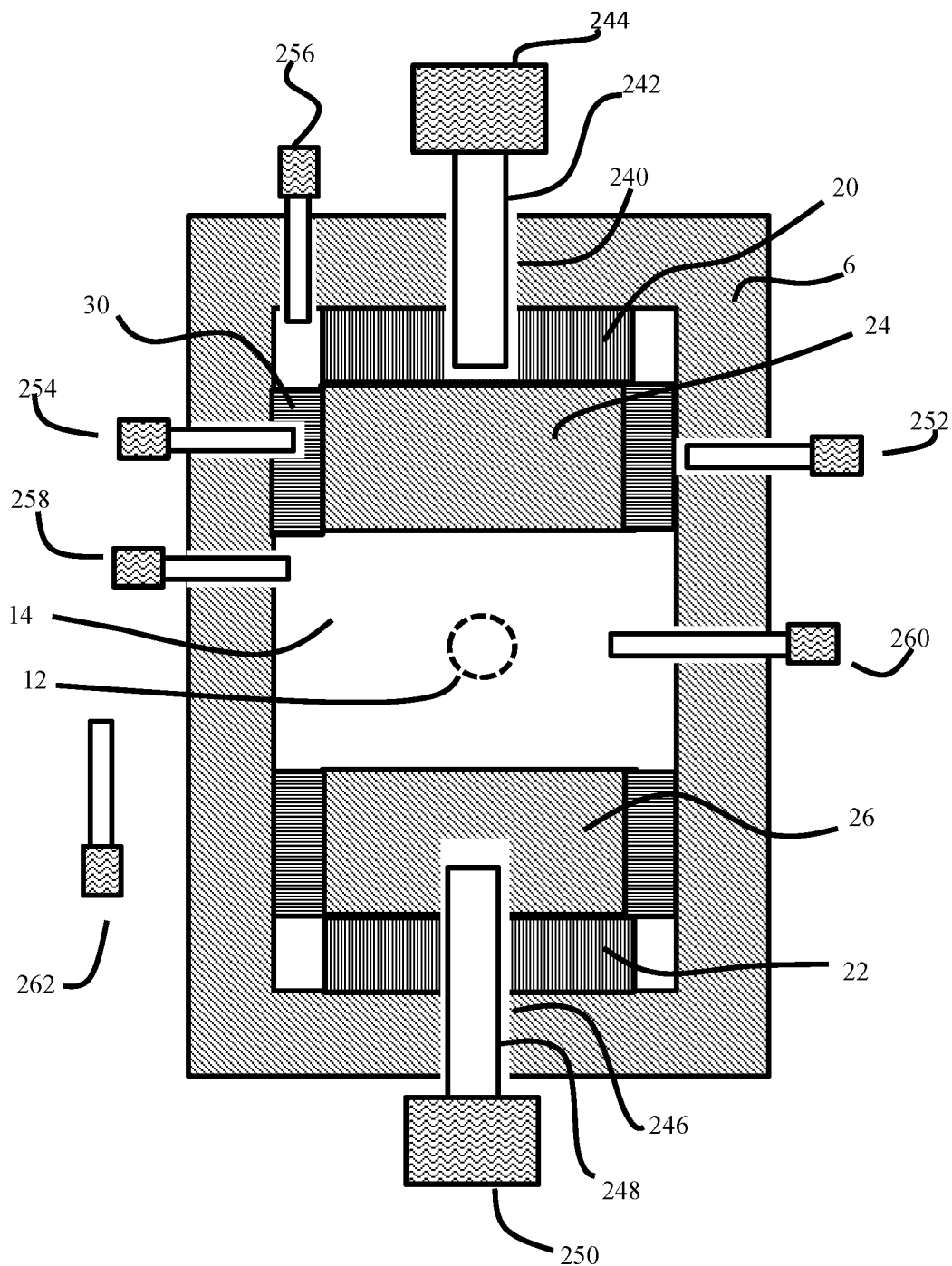
FIG. 7 is a diagrammatic side sectional view of yet another alternative embodiment of an apparatus according to the present invention, for the dynamic stabilization of magnetic fields of a permanent magnet assembly.

A large variety of regional locations in which a magnetically active element may affect the magnetic field in the working volume may be employed in the invention. A sampling of locations is shown in FIG. 7, using for illustrative purposes the magnet design introduced in FIG. 2. FIG. 7 shows a hole in the yoke 6 and upper permanent magnet block 20 which forms a regional location 240 for a magnetically active element 242 whose position in the regional location is controlled by the mechanism 244. The figure also shows a second hole in the yoke 6 and the lower permanent magnet block 22 and lower pole 26 that forms a regional location 246 for a second magnetically active element 248 whose location may be controlled by the second positioning mechanism 250. The sensor, algorithm, and control signals are omitted from FIG. 7 for the sake of graphical simplicity. The figure contains numerous additional sub-assemblies composed of "trios" comprised of regional locations, magnetically active elements, and positioning mechanisms at illustrative locations on the permanent magnet assembly. For example, the third trio 252 is shown at the side of the magnet, with a regional location formed by a hole in the yoke. Fourth trio 254 is shown in a similar location on the left side of the figure, with regional location formed by a hole that extends into the permanent magnet block 30. A fifth trio 256 is shown at the top of the figure, with the regional location extending through the yoke 6 and into a space inside the permanent magnet assembly. Sixth trio 258 likewise extends through the yoke and into the gap space 14, at a position that is closer to the upper pole 24 than to the lower pole 26. A seventh trio 260 similarly extends into the gap space 14, but this time at or near the mid-plane of the magnet, level with the working volume 12. The location of field stabilization device trio 260 may be advantageous in preserving the uniformity of the field in the working volume 12.

FIG. 7 also shows a field adjustment device 262 entirely outside the permanent magnet assembly structure. The location of adjustment device 262 on the figure in entirely schematic, in that any location outside of the assembly may be used as a regional location for a movable magnetically active element positioned by a mechanism. The location may be above, below, or to the right side of the assembly shown in FIG. 7. The location may be at a symmetric position with respect to the magnet assembly, for example, above the center of the top of the assembly structure, or at a non-symmetric location. For a magnet design with a yoke that presents an open side, for example an H-magnet as known in the art, the location of the field adjustment device 262 may be at or near the open side of the permanent magnet assembly. The device 262 may be within the physical envelope defined by the assembly structure, or it may be outside the physical envelope.

FIG. 7 shows trios of two sizes, a smaller size, for example small fifth trio 256 and a larger size, for example a larger first trio including the positional mechanism 244. A large trio element may include a rod or bolt 25 mm in diameter, for example, or even larger. A small trio may include a rod or screw 2 mm in diameter, for example, or even smaller. The definition of large and small is relative and also depends on the size scale of the permanent magnet assembly. Those with skill in the art are able to determine the useful sizes of the elements.

A larger trio element may be used as a coarse control of the magnetic field strength in the working volume, while a smaller trio element may be used for a fine control. It may be advantageous to practice the invention by using both a coarse and a fine trio element or elements within a permanent magnet assembly. Coarse control and fine control elements may be positioned in two separate regional locations. Coarse and fine control may be nested, with the fine control located within the larger coarse control element. Coarse and fine control may also be achieved using multiple trio elements of the same size, but constructed from materials with different levels of magnetic activity, as would be known to those skilled in the art. For example, a coarse control may be made from a material with a high magnetic permeability or a high saturation magnetization, while a fine control element may be constructed from a material with a low permeability or low saturation magnetization.

Figure 8A:
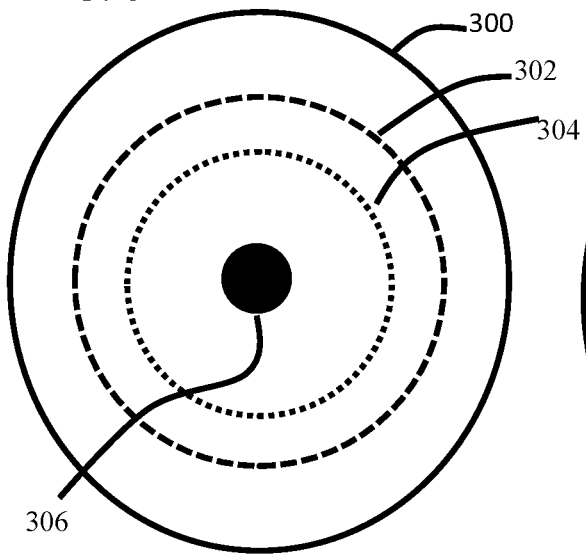
FIGS. 8A-D are diagrammatic end views of permanent magnet assemblies of a generally cylindrical form, showing four possible configurations and positional relationships amongst assembly yolk components, pole components, magnet blocks, and regional locations for magnetically active elements, in accordance with embodiments of the present invention.
Figure 8B:
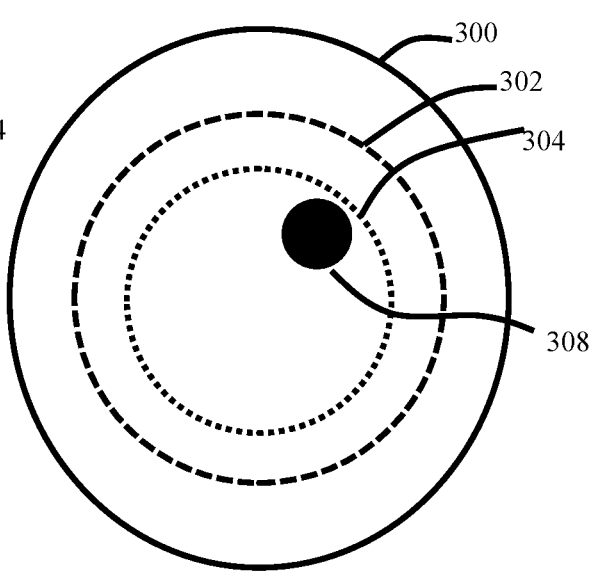
Figure 8C:
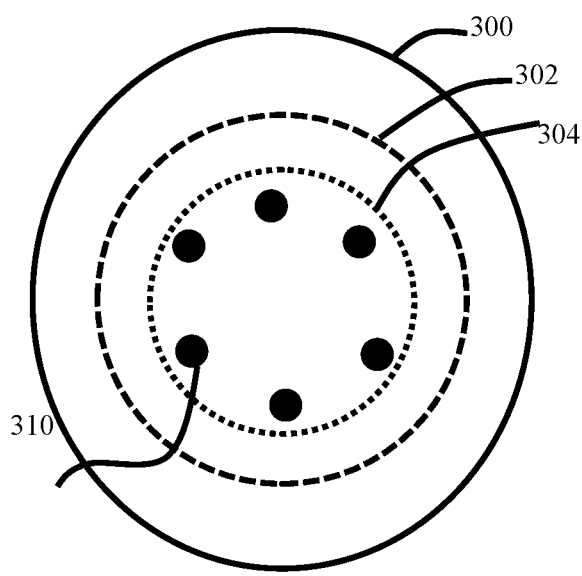
Figure 8D:
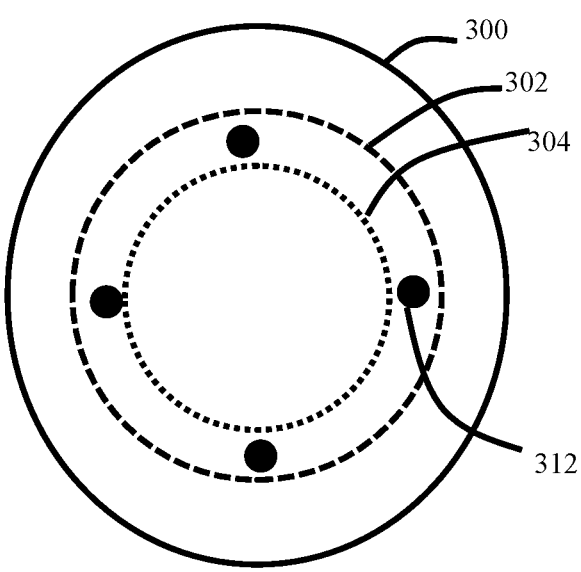

To further illustrate possible locations for the field adjustment elements according to the invention, FIGS. 8A-D show simplified end views of the permanent magnet assemblies of a generally cylindrical form. These end views may be considered to the end views of magnet assemblies of the type depicted previously in cross section (for example, FIGS. 1, 2, and 3). In FIGS. 8A-D, the outer edge of the yoke is shown as a solid line 300. The dashed line 302 depicts the inner cylindrical surface of the yoke, while the dotted line 304 depicts the outer diameter of the pole, which may also correspond to the outer diameter of a magnet block. In FIG. 8A (upper left), the circle 306 denotes the regional location for a magnetically active element, in this case positioned symmetrically in the center of the permanent magnet assembly. FIG. 8B (upper right) shows a regional location 308 at a non-symmetric position with respect to the assembly. FIG. 8C (lower left) shows a circular arrangement of six regional locations 310, positioned symmetrically above the back of the pole/block. Six respective trio elements may occupy these six locations in order to stabilize the field of the assembly. Alternatively, less than six elements may be used in the six locations 310, which may break the symmetry. A single one of the six positions 310 may be employed as a regional location for a magnetically active element. FIG. 8D (lower right) shows a circular arrangement of four locations 312 with the locations positioned inside the inner diameter of the yoke 302 and outside the outer diameter of the pole 304. In such a location, the magnetically active elements may extend through the yoke and into a space beside a magnet block. The associated trio elements may extend down to a permanent magnet block positioned to the side of the pole, for example, block 30 seen in FIG. 2. Four elements may be used in the four locations. The elements may be moved in concert, or one at a time, by the associated positioning mechanisms for each respective trio. Fewer than four elements may be used.

The positions for the regional locations for the movable elements as depicted in FIGS. 8A-D are but a few examples of the locations that may be used to practice the invention. Positions on both top and bottom surfaces of the permanent magnet assembly may be used. Positions and elements may be used symmetrically or asymmetrically. The elements may be moved simultaneously, or they may be moved one at a time. They may be moved in groups.

Figure 9:
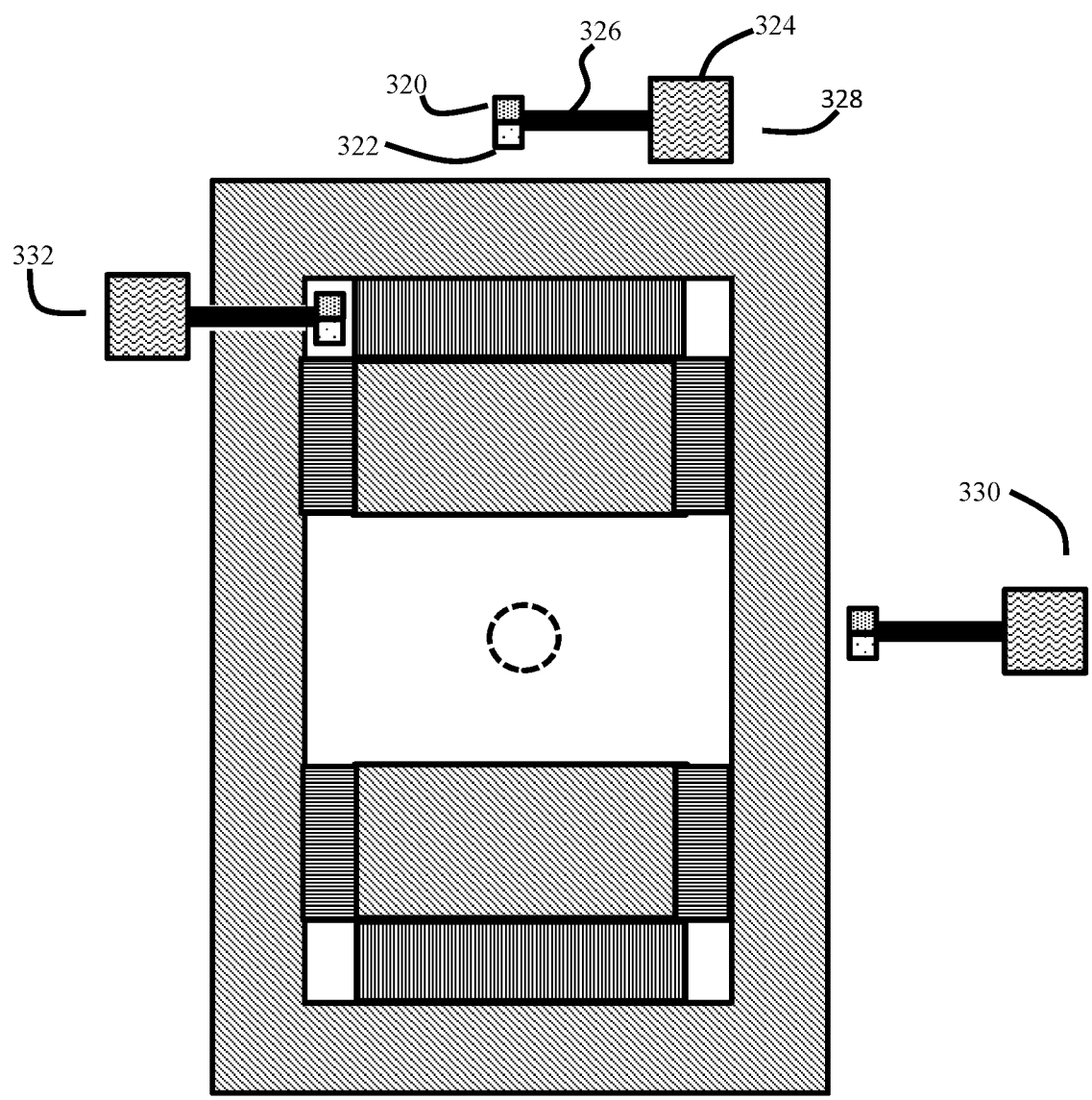
FIG. 9 is a diagrammatic side sectional view of an alternative embodiment of an apparatus according to the present invention, showing the use of permanent magnetic or hard magnetic materials as magnetically active elements.

FIG. 9 shows the invention practiced in an alternative manner using permanent magnetic or hard magnetic materials as the magnetically active elements. A bar of permanent magnet material with a north pole 320 and a south pole 322 is shown attached to a positioning mechanism 324 via a rod 326. The rod 324 may alternatively be considered to be part of the mechanism 324. The permanent magnet may be in the form of a disk rather than a bar, or indeed other shapes are also useful for the invention. The group of items 320, 322, 324, and 326 forms a field alteration unit 328 useful for altering the field in the working volume 12 of the magnet assembly. The alteration of the field may be achieved via translation or rotation or other movement of the permanent magnet block containing 320 and 322. Other locations for the field alteration units may also be used. Two examples of such alternative locations are shown, unit 330 and unit 332.

In all embodiments, the magnetically active element may be generally cylindrical, or generally square or rectangular. It may be tapered. It may be shaped in a manner that is advantageous in controlling the manner in which the magnetic field is altered. The element may be shaped to linearize the field adjustment with respect to some movement parameter. The element may be a screw with threads, or a modified screw. The element may be a bar, or a slug, or a sheet. The magnetically active element may be threaded.

The magnetically active element may be a permanent magnet that creates its own magnetic field. The orientation of the element may be utilized to change the manner in which flux flows through the assembly, thereby affecting the strength of the magnetic field in the working volume. The element may be rotated or translated to change the direction of its magnetic field with respect to the magnetic fields in the assembly. The element may be located in a region outside the assembly.

In the apparatus and method according to this disclosure, the regional location of the magnetically active element may be located in a hole in the yoke. It may be located in a hole in the permanent magnet block. It may be located in a region that is at least partially defined by a magnetically hard portion of the permanent magnet assembly. It may be located so that it extends through a magnetically soft portion of the permanent magnet assembly and into a region containing no solid material. It may be located in a hole that is in both the magnet block and the yoke. It may be located in a symmetric location behind the magnet block, on the axis of symmetry of the magnet assembly. It may be located behind the magnet block off the axis of symmetry of the assembly. There may be more than one regional location for more than one element. The plurality of elements may be located symmetrically with respect to the magnet assembly, or asymmetrically. The plurality of elements may be located behind or near one pole of the magnet, or behind or near both sides. The plurality of elements, in their plurality of regional locations, may be moved in a symmetric manner or an asymmetric manner. The elements may be located in regions to the sides of the poles or magnet blocks. The elements may be located in regions near or at the mid-plane of the magnet and extending toward the gap. The elements may be located outside of the yoke. The elements may be sized to completely fill the hole in another structure in the assembly, or the element may be sized so that it does not completely fill such a hole.

The regional location of the element may be included in the original design of the permanent magnet assembly, or the location and the provisions for mounting the element and the mechanism may be retrofitted on an assembly that was not originally designed for the field stabilizing device.

In all embodiments, the positioning mechanism may manipulate the position of the elements via rotations, translations, or a combination of these, such as a screw motion. The mechanism may be based on linear motor technology, including piezo electric devices. The mechanism may involve a lever. The mechanism may include a bimetallic structure or other structure that is itself sensitive to temperature. The temperature sensitive mechanism may perform the roll of sensor as well as element moving mechanism.

By way of illustration, an example of a structure that performs the roles of both sensor and controller may be a linear bimetallic strip that responds to the temperature of the magnet by curling and changing the position of one of its ends, in a manner known in the art of bimetallic structures used in thermostats. The change in position of the end of the bimetallic strip is then linked, via temperature, to the strength of the magnetic field. The end of the bimetallic strip that can move may be attached, directly or indirectly, to the magnetically active element, so that the movement of the end of the bimetallic strip moves the element in such a way as to control the magnetic field strength in a manner required by the device. Likewise, a coiled bimetallic strip, as known from the art of thermostats, may be used to rotate a threaded structure as the coiled strips responds to temperature. The threaded structure may then be mechanically associated with a magnetically active element in such a way that the rotation of the threaded structure controls the position of the element so that the magnetic field of the permanent magnet assembly is controlled in a manner required by the device.

The sensor may measure magnetic field. It may be based on the Hall Effect, or on magnetoresistive properties of some element, on atomic magnetometry, on nuclear magnetic resonance, or other technology for detecting magnetic fields. The sensor may detect temperature. It may be based on a thermocouple, on a resistance measurement, on a thermistor, or a diode, or any other transducer of temperature. The sensor may measure thermal expansion of some element, for example, the width of the gap between pole pieces. The sensor may measure any other property that can be correlated with the strength of the magnetic field in the working volume.

The signal produced by the sensor may be an electrical signal, such as a voltage level. It may be a mechanical signal, such as a linear or angular displacement, such as in a coiled bimetallic strip. It may be a digital signal. In the case of the mechanical signal, it may be possible for the mechanical signal to directly control the element positioning mechanism. It may be possible to implement the field stabilizer without using any electrical signals. The signal produced by the sensor may be transmitted by a physical object, such as a wire, or it may be transmitted wirelessly.

The sensor may generate a signal based on a data acquisition activity whose sole purpose is to generate the signal. The sensor may generate a signal from a data acquisition activity that may serve other purposes as well. An example of the latter is the generation of a measurement of magnetic field based on the existing data stream of an NMR instrument. In this example, a signal containing information regarding the field strength may be generated directly through analysis of the frequency content of the NMR signal. The separate sensor may be omitted.

The sensor may be employed to make measurements of magnetic field strength simultaneously with the other measurements being made in the device. The sensor may be employed at time points in between those at which the device is being used to make other measurements.

The algorithm that determines the manner in which the mechanism should move the element in response to the control signal provided by the magnetic field sensor may be implemented electronically using analog technology, using digital technology, or a combination of the two. The algorithm may be implemented by a mechanical mechanism, which may be incorporated directly in the mechanism that moves the element. The algorithm may be implemented in hardware, in software, or in a combination of these two.

The algorithm may incorporate feedback between the strength of the magnetic field as signaled by the sensor and the position of the element as controlled by the mechanism. The algorithm may have a predictive function that anticipates the positions of the element needed to best stabilize the field strength. The algorithm may be predictive such that expected future changes in the magnetic field strength may be corrected preemptively. The algorithm may call for motions of the element during the interval of utilization of the permanent magnet assembly, so that, for example, the field is dynamically stabilized during a measurement.

The algorithm may be designed to control the field strength so that the field strength lies within specified bounds surrounding a specified field strength. The field strength, as well as the bounds, may be specified by the user of the device as inputs into the algorithm. The bounds may be permanently set. The field strength may be permanently set. The field strength may be specified to have a time dependence, in which case the field may be controlled to have a specific dependence on time. For example, it may be advantageous for the field to be swept through a range of values during a time of utilization of the magnet assembly.

The permanent magnet assembly may be designed to produce a highly uniform field. The assembly may be intended for use in an apparatus for performing high-resolution nuclear magnetic resonance. The assembly may be a dipolar design with pole pieces. The assembly may be a design without pole pieces, such as a Halbach magnet.

The impact of the field stabilization element on the field uniformity may be larger, for example only 10 times smaller than the impact on the average field value.

An apparatus utilizing the permanent magnet assembly may contain temperature management items. It may contain insulation, or thermal homogenization elements, or active temperature control via heating or cooling. The invention may be practiced to dynamically stabilize the field of the assembly when such alternative methods for overcoming thermal effects are in use.

Only some embodiments of the invention and but a few examples of its versatility are described in the present disclosure. It is understood that the invention is capable of use in various other combinations and is capable of changes or modifications within the scope of the inventive concept as expressed herein. Modifications of the invention will be obvious to those skilled in the art and it shall be intended to cover with the appended claims all such modifications and equivalents. The disclosures of all United States patents cited hereinabove are expressly incorporated herein by reference.

I claim:

1. An apparatus for dynamically stabilizing the magnetic field strength in the working volume of a permanent magnet assembly, comprising:
   at least one movable, magnetically active element;
   a regional location corresponding to each element wherein:
      a position of each element within its corresponding regional location affects a strength of the magnetic field in the working volume; and
      a change in the position of each element within its corresponding regional location has an impact on an average field value in the working volume that is at least ten times larger than the change's impact on a maximum deviation of the magnetic field values from the average field value in the working volume;
   a mechanism, associated with each element, for controllably changing the position of the element within its corresponding regional location;
   at least one sensor for producing a sensor signal related to the strength of the magnetic field; and
   an algorithm, executed in a processing unit, for determining a movement imparted by each mechanism to its associated element in response to the sensor signal;
   whereby the magnetic field strength in the working volume is maintained within a predetermined range of values during a time interval of utilization of the apparatus.

2. The apparatus according to claim 1, wherein the movement imparted to at least one magnetically active element is a translational motion.

3. The apparatus according to claim 1, wherein the movement imparted to at least one magnetically active element is a rotational motion.

4. The apparatus according to claim 1, wherein a plurality of magnetically active elements and their associated regional locations are located in a manner symmetric with respect to the permanent magnet assembly structure.

5. The apparatus of claim 4, wherein the plurality of magnetically active elements are moved so that their positions are changed in a manner symmetric with respect to the permanent magnet assembly structure.

6. The apparatus according to claim 1, wherein at least one of the regional locations is at least partially defined by a magnetically hard portion of the permanent magnet assembly.

7. The apparatus according to claim 1, wherein at least one of the regional locations extends through a magnetically soft portion of the permanent magnet assembly and into a region containing no solid material.

8. The apparatus according to claim 1, wherein at least one of the regional locations extends into a portion of the permanent magnet assembly forming a gap space between the magnet assembly's poles.

9. The apparatus according to claim 1, wherein at least one of the regional locations is located outside the permanent magnet assembly.

10. The apparatus according to claim 1, wherein at least one of the regional locations is partially defined by a surface of a magnetic pole piece of the permanent magnet assembly.

11. The apparatus according to claim 1, wherein at least one of the regional locations extends into a magnetic pole piece of the permanent magnet assembly.

12. The apparatus according to claim 1, wherein a first one of the at least one magnetically active element and its corresponding regional location are selected so that their impact on the average field value in the working volume is larger than the impact, on the average field value in the working volume, of a second magnetically active element and its corresponding regional location.

13. The apparatus according to claim 1, wherein the at least one sensor detects indirectly the strength of the magnetic field by measuring temperature.

14. The apparatus according to claim 1, wherein the sensor detects indirectly the strength of the magnetic field by sensing the distance between pole faces of the permanent magnet assembly.

15. The apparatus according to claim 1, wherein the algorithm is predictive such that expected future changes in the magnetic field strength may be corrected preemptively.

16. The apparatus according to claim 1, wherein a value of the magnetic field strength is maintained such that it changes in time but remains within a predetermined range of values of a predetermined function of time during the time interval of utilization of the apparatus.

17. The apparatus according to claim 1, wherein a function of sensor of magnetic field strength, a function of correction algorithm, and a function of changing the position of the at least one magnetically active element are performed by a single component in the apparatus.

18. An apparatus for dynamically stabilizing the magnetic field strength in the working volume of a permanent magnet assembly used in a high resolution magnetic resonance apparatus that generates an NMR signal, comprising:
at least one movable, magnetically active element;
a regional location for each element wherein:
a position of each element within its corresponding region location affects the strength of the magnetic field in the working volume; and
a change in the position of each element within its corresponding region location has an impact on an average field value in the working volume that is at least ten times greater than its impact on a maximum deviation of the magnetic field values from the average field value in the working volume;
a mechanism associated with each element for moving the element and controlling the position of the element in its corresponding regional location;
a processing unit for calculating, from information in the NMR signal, the strength of the magnetic field in the working volume;
an algorithm executed in the processing unit for determining a movement imparted by each mechanism to its associated element in response to the NMR signal;
wherein the magnetic field strength in the working volume is maintained within a predetermined range of values during a time interval of utilization of the apparatus.

19. The apparatus according to claim 18, wherein a plurality of magnetically active elements and their associated regional locations are located in a manner symmetric with respect to the permanent magnet assembly structure.

20. The apparatus according to claim 18, wherein at least one of the regional locations is at least partially defined by a magnetically hard portion of the permanent magnet assembly.

21. The apparatus according to claim 18, wherein at least one of the regional locations extends through a magnetically soft portion of the permanent magnet assembly and into a region containing no solid material.

22. The apparatus according to claim 18, wherein at least one of the regional locations extends into a portion of the permanent magnet assembly forming a gap space between the magnet assembly's poles.

23. The apparatus according to claim 18, wherein at least one of the regional locations is located outside the permanent magnet assembly.

24. The apparatus according to claim 18, wherein at least one of the regional locations is partially defined by a surface of a magnetic pole piece of the permanent magnet assembly.

25. The apparatus according to claim 18, wherein at least one of the regional locations extends into a magnetic pole piece of the permanent magnet assembly.

26. The apparatus according to claim 18, wherein a first one of the at least one magnetically active element and its corresponding regional location are selected so that their impact on the average field value in the working volume is larger than the impact, on the average field value in the working volume, of a second magnetically active element and its corresponding regional location.

27. The apparatus according to claim 18, wherein the algorithm is predictive such that expected future changes in the magnetic field strength may be corrected preemptively.

28. The apparatus according to claim 18, wherein a value of the magnetic field strength is maintained such that it changes in time but remains within a predetermined range of values of a predetermined function of time during the time interval of utilization of the apparatus.

* * * * *